United States Patent [19]
Lee et al.

[11] Patent Number: 6,107,000
[45] Date of Patent: Aug. 22, 2000

[54] METHOD FOR PRODUCING MICRO-OPTIC ELEMENTS WITH GRAY SCALE MASK

[75] Inventors: Sing H. Lee, Del Mar; Walter Däschner, La Jolla, both of Calif.

[73] Assignee: Board of Regents - University of California - San Diego, San Diego, Calif.

[21] Appl. No.: 08/766,139

[22] Filed: Dec. 17, 1996

[51] Int. Cl.⁷ .................................................. G03C 5/00
[52] U.S. Cl. ............................ 430/296; 430/5; 430/325; 430/321
[58] Field of Search ................... 430/5, 296, 323, 430/321, 325; 359/19

[56] References Cited

U.S. PATENT DOCUMENTS

| | | | |
|---|---|---|---|
| 5,078,771 | 1/1992 | Wu | 65/30.11 |
| 5,079,130 | 1/1992 | Derkits, Jr. | 430/321 |
| 5,114,813 | 5/1992 | Smoot et al. | 430/5 |
| 5,126,006 | 6/1992 | Cronin et al. | 156/643 |
| 5,145,757 | 9/1992 | Smoot et al. | 430/5 |
| 5,213,916 | 5/1993 | Cronin et al. | 430/5 |
| 5,310,623 | 5/1994 | Gal | 430/321 |
| 5,334,467 | 8/1994 | Cronin et al. | 430/5 |
| 5,480,764 | 1/1996 | Gal et al. | 430/321 |
| 5,508,803 | 4/1996 | Hibbs et al. | 356/243 |
| 5,538,817 | 7/1996 | Smith et al. | 430/5 |

OTHER PUBLICATIONS

Däschner, et al., "Fabrication of Diffractive Optical Elements Using a Single Optical Exposure with a Gray Level Mask," *J. Vac. Sci. Technol. B*, 13(6):2729–2731, Nov./Dec. 1995.

Däschner, et al., "One–Step Lithograpy for Mass Production of Multilevel Diffractive Optical Elements Using a High Energy Beam Sensitive (HEBS) Gray–Level Mask," *SPIE*, 2689:153155, Feb. 1996.

Dialog Search Report.

*Primary Examiner*—Janet Baxter
*Assistant Examiner*—Rosemary Ashton
*Attorney, Agent, or Firm*—Denise L. Mayfield; Locke Liddell & Sapp LLP

[57] ABSTRACT

A method for producing micro-elements, such as micro-lenses and computer generated holograms using a gray scale mask formed of a high energy beam sensitive glass plate which may be darkened by direct writing of an electron beam to record a gray scale pattern corresponding to a predetermined depth level to be etched into a photoresist coated substrate. The high energy beam sensitive glass may have a base glass composition which is provided with an ion exchanged surface layer containing a high concentration of silver ions. High energy beam sensitive glass plates are exposed to various electron beam charge densities at relatively low acceleration voltages and over relatively small grid spacings to provide a wide range of gray levels. Photoresist coated substrates are exposed through the gray scale mask and subsequently etched by chemically assisted ion beam milling to produce high efficiency micro-lenses and similar micro-elements having high surface resolution.

19 Claims, 5 Drawing Sheets

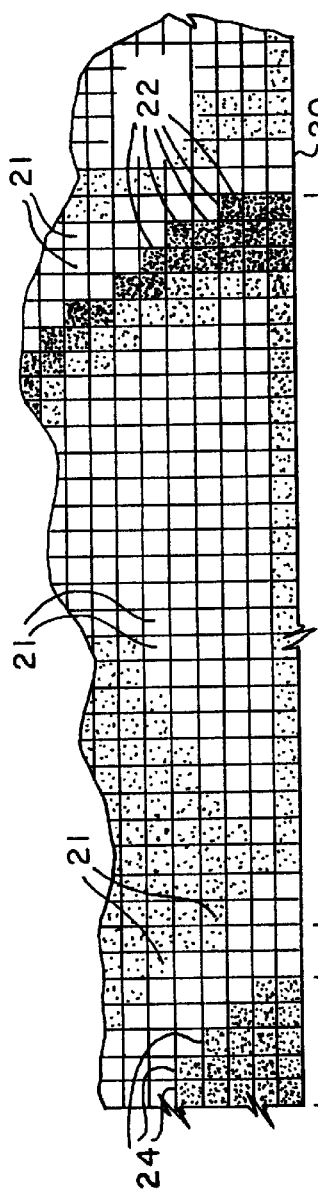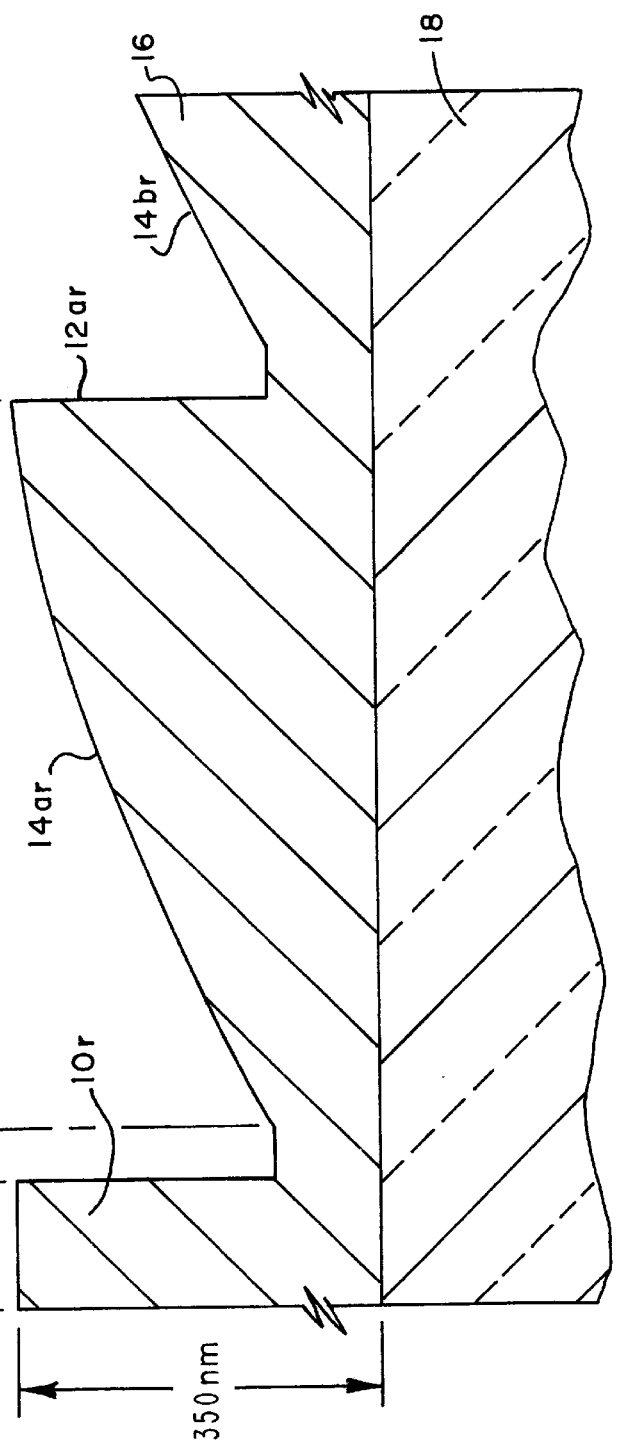

METHOD FOR PRODUCING MICRO-OPTIC ELEMENTS WITH GRAY SCALE MASK

FIELD OF THE INVENTION

The present invention pertains to a method for producing diffractive optical elements and other micro-optical elements using a gray scale mask formed from high energy beam-sensitive (HEBS) glass.

BACKGROUND

This invention was made with Government support under Grant No. MDA972-94-1-0002 awarded by ARPA. The Government has certain rights in this invention.

The continuing development of exceedingly small or so-called micro-devices such as micro-optic elements and micro-machines is of great importance to optoelectronic interconnection technologies and the development of communications and control systems. Diffractive optical elements such as spherical, cylindrical, Fresnel lenses, aspherics and other micro-devices having rather precise three dimensional profiles or contours present certain problems with respect to volume production of these elements of an acceptable quality, in particular. The fabrication of large arrays of such elements covering large areas is very costly with regard to known methods of production.

One technique for mass production of diffractive optical elements involves fabricating a master element which itself is made by etching processes similar to those used in the fabrication of micro-electronic circuits and similar devices wherein a multi-masking process using binary masks is conducted. The fabrication of a master or individual elements using a multi-binary mask method can result in significant dimensional errors in the master and the fabricated element due to residual alignment errors between consecutive masking steps. Although diamond turning, for example, can be employed in producing a master element, the multi-binary mask technique is limited with symmetric elements, for example. Still further, diffractive optical elements can be produced by injection molding, embossing or casting. However, the materials used in these techniques have limited optical and environmental properties, and are, for example, operable to be transmissive to radiation only in the spectral range visible to the human eye.

Some of the disadvantages of prior systems including those mentioned above have been overcome with the development of so-called gray scale masks which avoid multiple processing steps by providing a single mask which contains all of the information necessary for generating multi-phase levels, i.e., the three-dimensional contours required in a diffractive optical element and the like. Photographic emulsions have been used to provide gray scale masks which can be generated using a laser writer or an optical imaging system, for example. However, the high resolution required of diffractive optical elements and other micro-elements is limited with this technique due to the limited resolution of the laser writer and the graininess of the image on the emulsion based mask. Moreover, photographic emulsions are not particularly durable and do not allow cleaning of the mask with water or mechanical scrubbing.

Other gray scale masking techniques, including the so-called half tone binary mask, are also limited due to the small holes in the mask which will also diffract light passing through the mask, further limiting the resolution of the desired diffractive optical element, for example.

One improvement in the production of gray scale masks for use in fabricating diffractive optical elements and other micro-elements has been realized with the provision of a gray scale mask wherein different thicknesses of a light-absorbing material, such as Inconel, coated on a glass plate mask element, for example, can provide for the fabrication of a gray level mask with high resolution and compatibility with substantially all wavelength ranges used in optical lithography. However, one disadvantage of this technique is the cost of the mask generation method wherein multiple direct write steps are required to provide the lift off process of the light-absorbing material for each discrete thickness desired. The tight thickness control necessary in the material evaporation step makes this technique somewhat economically infeasible for many applications.

The use of a gray scale mask fabrication method for producing large quantities or large arrays of diffractive optical elements and similar micro-elements requiring high resolution of three dimensional contours has several advantages. Gray scale masks require only a single exposure of a photoresist when fabricating the elements on a substrate using an etching process. Gray scale masks thus avoid the alignment errors resulting from processes requiring the use of multiple binary masks. Moreover, if a suitable gray scale mask material is provided, thermal expansion and contraction of the mask can also be avoided.

Accordingly, there has been a continuing need to develop an improved fabrication method for relatively large quantities of and large arrays of micro-elements, such as diffractive optical elements or other elements covering large areas, such as computer generated holograms. It is to these ends that the present invention has been developed.

SUMMARY OF THE INVENTION

The present invention provides an improved method for producing micro-elements, including diffractive optical elements and the like, using a gray scale mask.

The present invention also provides an improved method for producing a gray scale mask comprising a glass article which is sensitive to exposure to a high energy electron beam, for example, to provide a pre-determined pattern on the article by varying the optical density of the glass as a result of exposure to the high energy electron beam.

In accordance with one aspect of the present invention micro-elements, such as diffractive optical elements, computer-generated holograms and other three dimensional micro-elements, may be produced with greater accuracy of the prescribed geometry of the element and in large quantities or large arrays by providing a gray scale mask having a masking pattern developed on a durable glass substrate comprising a high energy beam sensitive (HEBS) glass. The glass substrate or article includes a body portion and an integral ion exchanged surface layer which, upon exposure to high energy electron beams, becomes darkened to a selected degree to provide the gray levels required for developing the various depths or phase levels in the three dimensional elements to be manufactured using the mask. In particular, the mask glass article preferably comprises a plate of a high energy beam-sensitive glass having an integral ion exchanged surface layer containing a high concentration of $Ag^+$ ions and/or a large number density of AgCl-containing and/or $Ag_2O$-containing and/or $Ag^+$ ion-containing micro-crystals and/or micro-phases, and also containing silanol groups and/or water in the concentration range of about 0.01% to 12.0% by weight water. The gray scale mask may also be formed of a glass such as a silicate glass composition hydrated and containing silver and which can be effectively written with high energy beams, such as electron beams, to produce high optical density images thereon.

In accordance with another aspect of the present invention a method for generating a gray scale mask is provided wherein a glass mask element is provided with a predetermined masking pattern formed directly thereon to provide a durable mask structure which eliminates the need for thin film coatings and ablative thin film materials. The particular method for producing a mask structure contemplated by the present invention comprises exposing a high energy beam-sensitive glass plate directly to an electron beam, using a commercially available electron beam writing device, at a relatively low acceleration voltage to provide a more precise configuration of the mask image pattern and the variations of optical density required to generate the various gray levels. In particular, acceleration voltage is controlled to produce sufficient penetration depth in the mask material without extending the electron trajectories unnecessarily with the resultant loss in resolution of the mask pattern.

In accordance with still another aspect of the present invention micro-elements, such as diffractive optical elements, are fabricated with improved geometries using a gray scale mask formed of a glass composition which is operable to provide stable images generated by exposure to an electron beam which may be controlled to generate a precise image on the glass. A gray scale mask in accordance with the invention may be reused many times, is relatively insensitive to exposure to environmental factors and is capable of providing high resolution and the resultant precise contour or dimensional control over the workpiece.

The present invention further provides an improved method of fabricating micro-optic devices, such as diffractive optical elements, with a gray scale mask which is simplified and cost effective, and wherein only a single mask needs to be exposed in an electron beam writer and wherein no multiple resist processing steps are required to generate the mask. Since the multiple levels or contour shading of the gray levels are written in a single step on a single mask the inevitable misregistrations between multiple lithography steps used in prior art mask fabricating methods are avoided.

Still further, the number of processing steps for fabrication of micro-elements compared to the steps required in fabrication methods using binary masks is substantially reduced in the method of the present invention wherein the element workpiece material may be optimized, that is the material which is best suited for the application can be chosen without being limited by the constraints of a molding material used in molded element fabrication methods.

Moreover, the method of the invention utilizes certain materials, tools and equipment compatible with the fabrication of large scale integrated electronic circuits. In this regard, the development of new fabrication techniques, environments and computer programs, for example, are not required to be established. The reduction in the number of steps involved in the fabrication method of the present invention will improve the efficiency and speed of the fabrication process. In this regard, mass production may be carried out based on a step and repeat photoresist exposure process followed by a chemically assisted ion beam etching batch process, for example.

Those skilled in the art will further appreciate the above-mentioned advantages and superior features of the invention together with other important aspects thereof upon reading the detailed description which follows in conjunction with the drawing.

BRIEF DESCRIPTION OF THE DRAWING

FIG. 5A is a partial plat of a grid showing darkened areas corresponding to changes in contour of portions of the lens shown in FIG. 4;

FIG. 5B is intended to be read in conjunction with FIG. 5A and shows a partial transverse section on a larger scale of the micro-lens shown in FIG. 4;

DETAILED DESCRIPTION OF THE PREFERRED EMBODIMENTS

Figure 1:
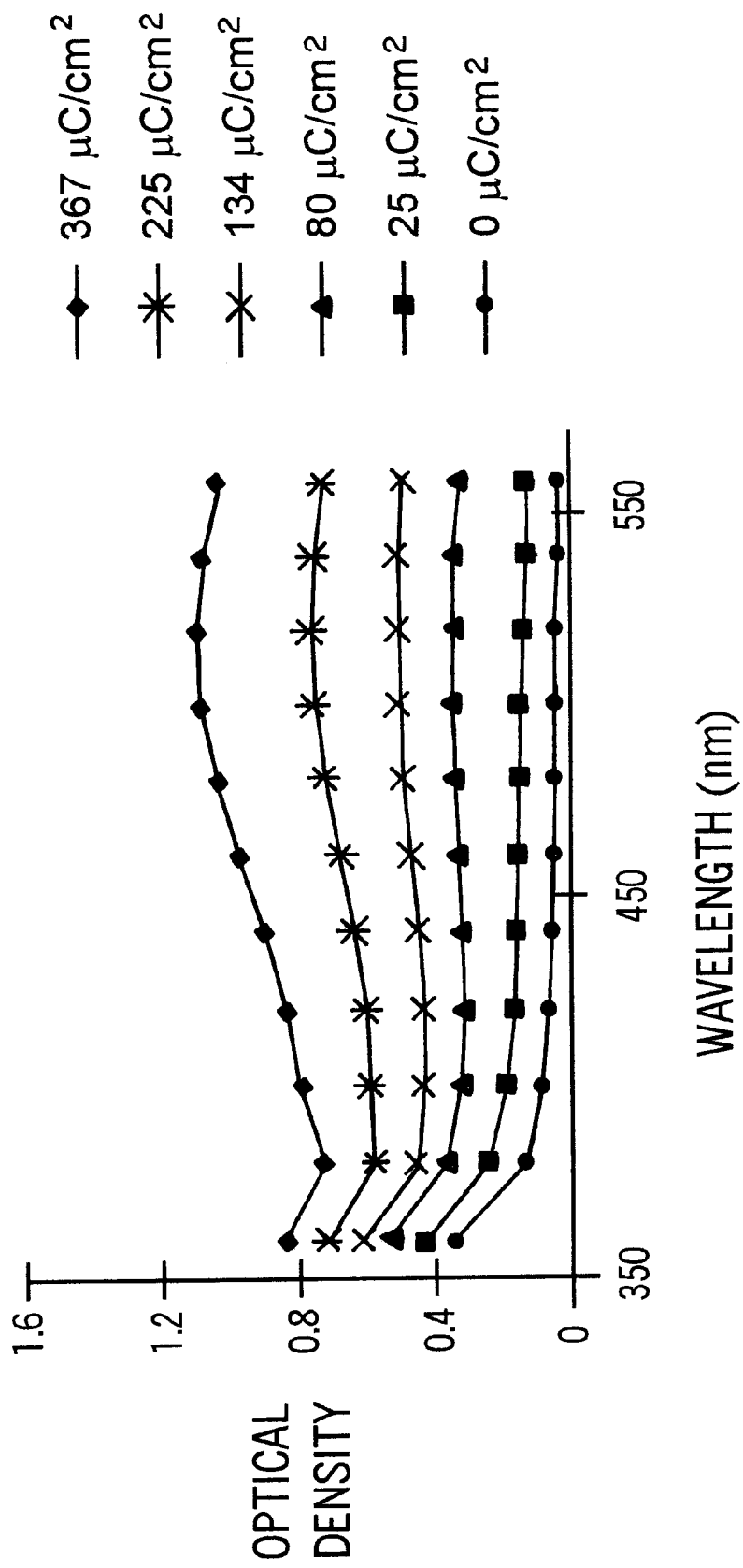
FIG. 1 is a diagram showing the variation in optical density of a gray scale mask formed of high energy beam sensitive glass after exposure with an electron beam of a particular acceleration voltage.

In the description which follows like elements are marked throughout the specification and drawing with the same reference numerals, respectively. Drawing figures showing actual physical elements are not intended to be to scale.

Several types of micro-elements are required to be of a three dimensional configuration which includes a variable surface contour or geometry and which may be symmetric or non-symmetric. Micro-optic devices such as micro-lenses, wave guides and computer generated holograms, for example, often require a geometry which is preferably a continuously curved surface or which has a profile of continuously varying depth from a reference point. Examples are diffractive optical elements such as spherical micro-lenses, Fresnel lenses and certain optical waveguide and coupling devices. The fabrication of such elements may be carried out, generally, using methodology similar to that used for the fabrication of very large scale integrated circuits (VLSI) wherein a photoresist material is placed on a substrate and is etched to produce a replica of the micro-element, preferably to a finely detailed and precise geometry. This precision geometry is particularly important for micro-optic devices and micro-machines, for example.

Gray scale masks (also known as gray "level" masks) have been developed, as mentioned hereinabove, to provide the necessary surface contours of micro-elements, including micro-lens devices, to replace the multi-step binary fabrication methods for these devices. However, the shortcomings of prior art gray scale masks mentioned hereinabove have inhibited the development of a method for volume production of micro-optic elements and other micro-elements. In accordance with this invention it has been discovered that an improved gray scale mask suitable for use in the fabrication of precise, highly efficient micro-optic elements can be provided using, as the mask structure, glass plates which have been composed to be sensitive to controlled electron beams to generate a darkened image in the glass having a precise configuration and having a substantially continuously varying light transmissivity capability over a pre-determined area.

The present invention contemplates the provision of a gray scale mask comprising a structure formed of a base glass such as a low expansion zinc-boro-silicate glass or so-called white crown glass. The base glass composition also contains alkali to facilitate an ion exchange reaction which achieves the sensitivity of the glass composition to high energy beams. After ion exchange the glass material becomes alkali-free as a result of the ion exchange process, which is typically carried out in an acidic aqueous solution at temperatures above 320° C. The base glass composition comprises silica, metal oxides, nitrates, halides and photo inhibitors. Typically, $TiO_2$, $Nb_2O_5$ or $Y_2O_3$ are used as photo inhibitors. The photo inhibitors are used to dope silver-alkali-halide complex crystals, for example. The $(AgX)_m(MX)_n$ complex crystals are beam sensitive and the doping process increases the energy band gap of the otherwise photosensitive material.

The beam sensitive glass used in the present invention may be of a type may be such as described in U.S. Pat. No. 5,078,771 issued Jan. 7, 1992 to Che-Kuang Wu, which is incorporated by reference herein. Other glasses which are beam sensitive and which may be used to fabricate a gray level mask in accordance with the invention are described in U.S. Pat. No. 5,114,813 issued May 19, 1992 and U.S. Pat. No. 5,145,757 issued Sep. 8, 1992, both to Steven W. Smoot, et al., which are also incorporated herein by reference. However, the invention is not necessarily limited to the particular glass compositions described hereinabove for fabrication of the gray scale masks and other materials which are darkenable in different degrees in accordance with the invention may be used.

Accordingly, a gray scale mask in accordance with the present invention may be fabricated from a glass structure or similar material comprising a relatively thin plate which, after being drawn, ground and polished is treated in such a way that at least one surface of the plate (or a similar glass article) becomes effective to render the surface darkenable upon exposure to electron beam radiation over at least a portion of the surface and wherein the plate or article is preferably substantially not alterable by or sensitive to actinic radiation. Preferably, the gray scale mask article is exposed to a high energy beam, such as an electron beam, preferably at an acceleration voltage of greater than about 20 kV (kilovolts) whereby the necessary change in transmissivity or optical density of the article is such that a gray scale mask can be produced while maintaining good resolution of the image produced on the glass.

Figure 2:
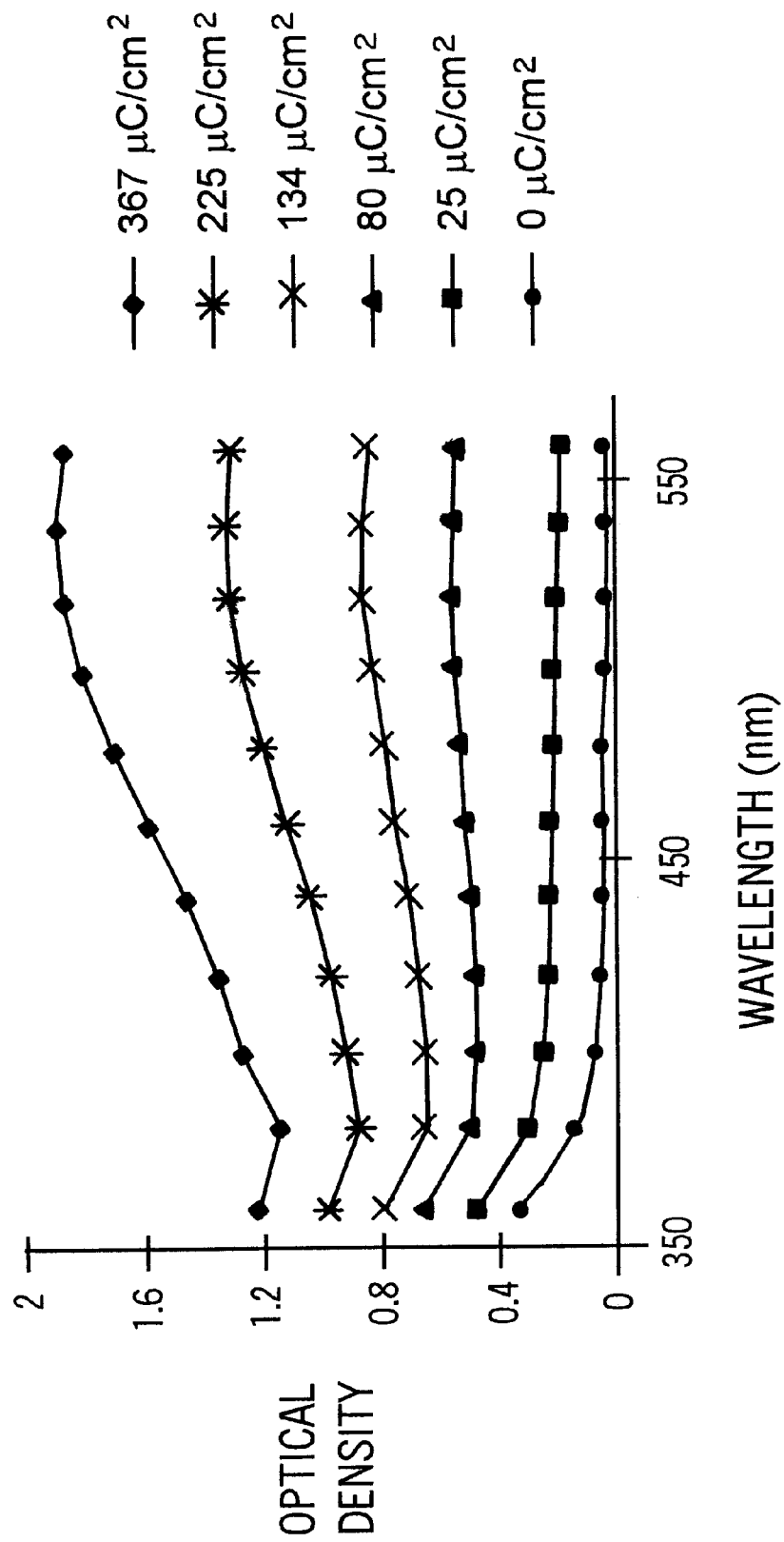
FIG. 2 is a diagram similar to FIG. 1 showing the variation in optical density of a mask formed of the same material after exposure to a beam of higher acceleration voltage.

Referring to FIGS. 1 and 2, and by way of example, diagrams of the optical density or optical transmissivity of a gray scale mask in accordance with the invention are illustrated showing the variation in optical density for light of wavelengths between about 350 nm (nanometers) and 550 nm for electron beam acceleration voltages of 20 kV (FIG. 1) and 30 kV (FIG. 2) for electron charge densities or "dosages" ranging from 0 to 367 $\mu C/cm^2$ (micro-coulombs per centimeter squared). A writing current of about 25 nA (nanoamperes) was used in obtaining the data for FIGS. 1 and 2.

A gray scale mask comprising a glass article of a composition in accordance with the teachings of U.S. Pat. No. 5,078,771 can be produced using a commercially available electron beam writing device. These devices can be controlled to expose the glass article, such as a plate, to an electron beam to generate images of varying optical density wherein the image is generated on a grid having grid spacings of about 0.1 mm, for example. The grid spacings may be smaller if desired but the writing time is increased accordingly. Larger grid spacings will tend to reduce image resolution. The lower of the two acceleration voltages used to generate the data in FIGS. 1 and 2 is preferable to minimize the spreading of the darkened spacings on the grid by the electron beam. Since the size of the interaction volume of the electron beam with the glass material depends on the energy of the incident beam the lowest acceleration voltage which still achieves a high enough penetration depth for sufficient optical density is preferred. An acceleration voltage of 20 kV produces enough penetration in the glass material of a gray scale mask as described herein without extending the electron trajectories unnecessarily in a way which would result in the loss of image resolution. The operating parameters of the beam writer or a similar device may be varied with the particular beam sensitive material being used to fabricate the gray scale mask and the values given herein are for an exemplary embodiment of the invention.

Preparation of a glass plate utilizing the electron beam-sensitive glass for generating the pre-determined gray scale darkened areas preferably includes depositing a so-called grounding layer of material on the surface of the glass. The purpose of this layer is to avoid local electrical charging of the mask plate during the electron beam writing process. A grounding layer in the form of a layer of chromium of a thickness of about 10.0 nm may be applied to the glass plate surface adjacent to the ion exchanged surface layer of the glass containing the high concentration of silver ions. The chromium grounding layer may be removed by wet etching after the mask plate is darkened to the predetermined gray level pattern desired.

Figure 3:
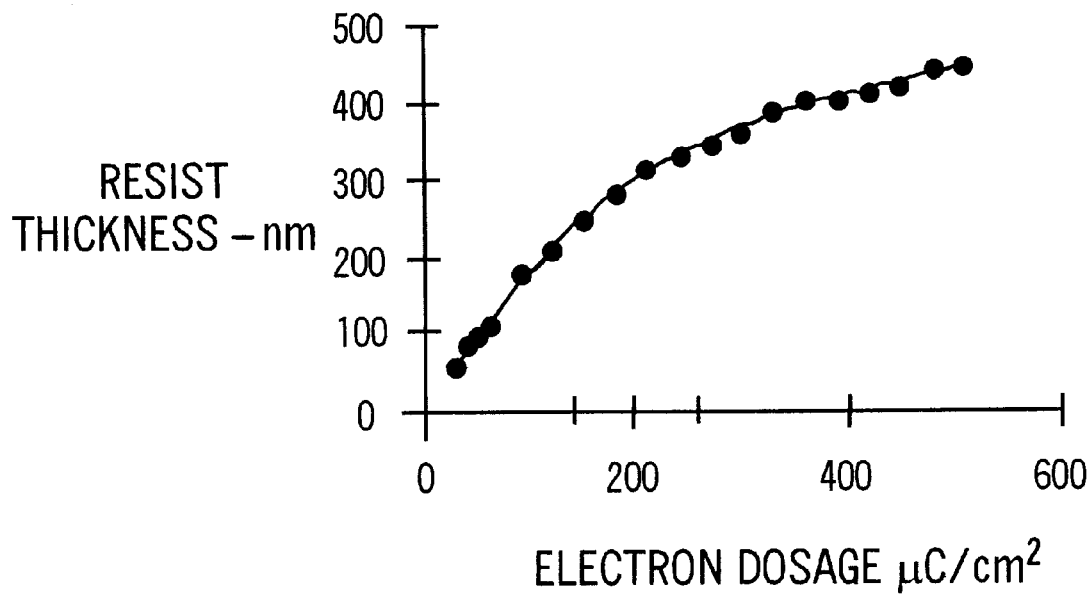
FIG. 3 is a diagram showing photoresist thickness versus electron charge density or dosage used to expose a gray scale mask in accordance with the present invention.

In the fabrication of a diffractive optical element as well as other micro-elements using a photoresist material on the surface of a substrate and an etching process to develop the photoresist and the substrate, a correlation must be obtained between the electron charge density or dosage (in coulombs per centimeter squared, for example) which will be applied to the gray scale mask and the corresponding thickness of penetration of the photoresist during the resultant exposure of the photoresist through the gray level mask. FIG. 3 shows, by way of example, a calibration curve for depth of penetration in a photoresist, such as a type OeBR-514 photoresist available from Olin-Ciba-Geigy Corporation, for example, compared with electron beam charge density applied to the mask grid spacings, respectively. In other words if a depth contour in the substrate such as a diffractive optical element is to be correlated with the thickness of a photoresist which is to be altered by exposure through the gray level mask, then a corresponding degree of darkening of the mask must be achieved and the electron dosage which will achieve this darkening can be correlated directly with the degree of penetration or exposure of the photoresist. For the sake of discussion herein it will be assumed that, if a large amount of exposure light is transmitted through a particular mask to the photoresist, then the height of the processed photoresist is limited and the thickness of the micro-element produced in the etching process is correspondingly small. If the amount of light transmitted through a particular mask opening is small, then the height of the processed photoresist is large and the corresponding thickness or height of the processed substrate article is also correspondingly large. Photoresist materials which, upon exposure to varying light intensities, respond in the opposite manner upon processing, may, of course, be used in conjunction with the method of the present invention.

In designing a surface profile for a particular diffractive optical element, a particular number of evenly spaced depth levels may be selected. For example, for a photoresist thickness of about 350 nm, thirty-two depth levels of penetration of light which will alter the characteristics of the photoresist may be selected and these different depth levels may then be correlated with a particular electron beam dosage to cause the appropriate darkening of the gray level mask. In other words, thirty-two different gray levels are generated.

For the particular gray level mask discussed herein, an acceleration voltage for the electron beam of 20 kV may be selected, so as to avoid substantial exposure time of the beam at each grid spacing. For the production of diffractive optical elements such as spherical lenses having a focal length of about 4.4 mm and a lens size of about 100 m×100 m a grid spacing of about 0.1 m may be selected, for example. A photoresist having a thickness of about 350–500 nm will produce a depth in the micro-element substrate in the range of three to six times the depth of the photoresist so that, for example, the substrate profile may have a total depth of up to about 2100 nm, by way of example. Again, by way of example, the design of the surface profile is spaced out over thirty-two evenly spaced depth levels over a 350 nm thickness range of the photoresist. With a grid spacing of 0.1 m the different depth levels may then be written into a computer program for controlling the electron beam writer in a way wherein the program controls the writer to dwell for a predetermined period of time at each grid spacing.

Figure 4:
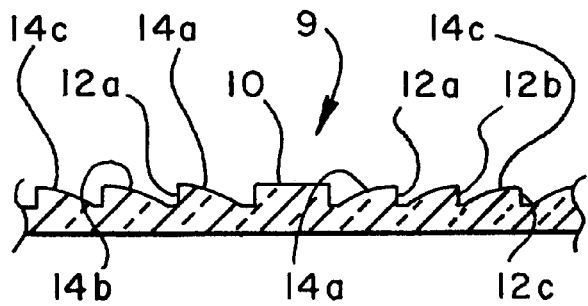
FIG. 4 is a transverse section view of a portion of a micro-lens fabricated in accordance with the method of the present invention.

FIG. 4 illustrates a cross sectional profile for a generally circular lens 9 having a hub portion 10, concentric circumferential lens surfaces 12a, 12b, 12c and 12d and corresponding concentric contoured lens surfaces 14a, 14b, 14c and 14d. These lens surfaces may be repeated at selected radii from the hub portion 10 in accordance with known practices for spherical or Fresnel lens design, for example. Referring to FIG. 5B, a portion of the cross-sectional profile of the lens 9 is shown on a processed photoresist layer 16 disposed on a substrate 18 of a suitable light transmissive material, such as quartz glass, silica glass or germanium to be used as the lens itself. Quartz glass is used in an example described hereinbelow.

In FIG. 5B, the layer of photoresist 16 is shown with the contour or profile of the lens 9 formed therein for the sake of clarity. Accordingly, a portion of the hub 10 of lens 9 is indicated at 10r, the contoured lens surface 14a is indicated at 14ar, the circumferential lens surface 12a is indicated at surface 12ar and the contoured surface 14b is indicated at 14br, for example.

FIG. 5A is intended to be read in conjunction with FIG. 5B and shows a portion of a grid 20 having the spacings mentioned above and showing, for example, grid spacings 21, of equal area, that is, squares of 0.1 μm, exemplary ones of which are shown darkened to varying degrees to provide the thirty-two depth or phase levels in the photoresist 16 and eventually in the lens 9. Of course, the grid 20 exists only in the micro-processor which controls the electron beam writer and the spacing of the writing mechanism as it moves from one spacing 21 on the grid to the next spacing and the electron beam is then generated to darken the spacings, accordingly. Representative darkened grid spacings are indicated at 22 defining the edge of the circumferential surface 12a, for example. Representative grid spacings 21 which have been slightly darkened, as indicated at 24, show the contour of the periphery of hub portion 10 of the lens as represented on the contour of the etched photoresist 16. Darkened grid spacings indicated at 25 define the edge or juncture of surfaces 12br and 14br, for example.

Accordingly, for a particular photoresist material, the thickness of the photoresist which is to remain after exposure and etching may be correlated with the electron beam dosage required to darken a high energy beam-sensitive glass of the type described herein and the contour or profile of a micro-optic element or other micro-element may be correlated with the dosages or beam charge density required for each subdivided space in a grid. The electron beam writing device may be controlled to index to each of the spaces 21 in the grid and apply a pre-determined electron beam dosage to that space corresponding to the degree of darkening of the gray level mask desired. Of course, the size of the grid spaces may be varied, the acceleration voltage may be varied and the electron beam charge density-may be varied depending on the characteristics of the particular mask material and the photoresist material being used.

Electron beam dosing of the gray scale mask plate at each of the grid spacings 21 will darken the glass across the grid to produce the gray levels desired. After removal of the aforementioned electrical charge grounding layer no further treatment of the gray scale mask is necessary, the gray levels are visible and repairs or additional image configurations or other features may be provided by additional writing operations with the electron beam writer.

Figure 6:
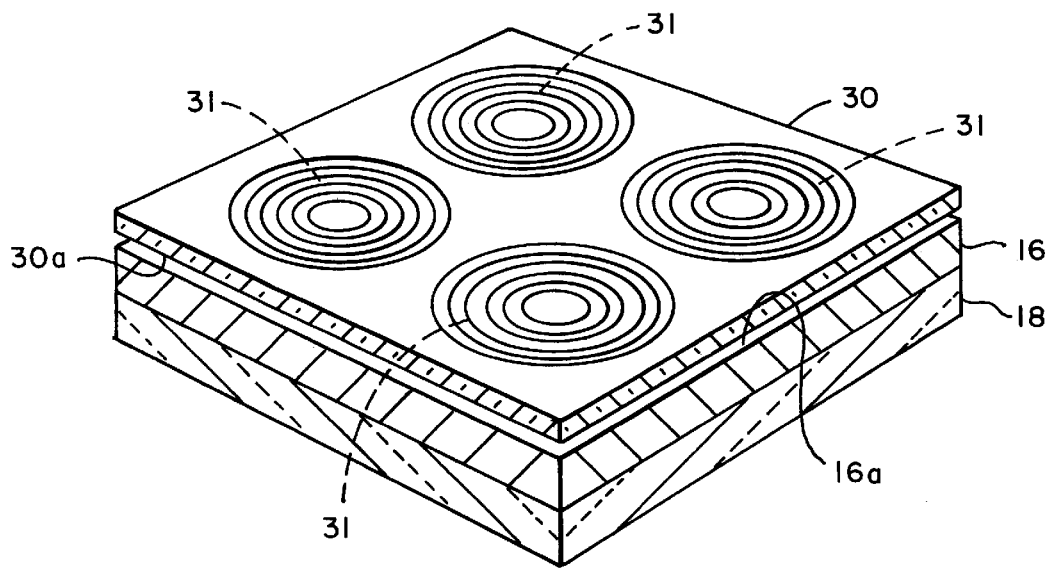
FIG. 6 is a perspective view, greatly enlarged, of a gray scale mask and a photoresist coated substrate for fabricating an array of micro-lenses in accordance with the present invention.

Fabrication of micro-elements, such as diffractive optical elements, may then be carried out using a gray scale mask fabricated in accordance with the description hereinabove. For example, a gray scale mask 30 is shown in FIG. 6 comprising a glass plate formed of a glass of the type described above and in the patents referenced herein and which has been exposed to an electron beam writer to generate gray level images of an array of generally spherical micro-lenses, as indicated by the images 31 in FIG. 6. These images are in the surface layer 30a facing surface 16a of the photoresist layer 16. The gray scale mask 30 may then be brought into contact or close proximity with surface 16a of photoresist 16 which is disposed on a quartz glass plate 18.

Equipment used in the production of micro-electronic devices by exposure of photomasks to photoresist coated substrates may be used to produce diffractive optical elements in accordance with this invention. For example, the gray scale mask 30 may be placed in contact with or close proximity to the layer of photoresist 16 in a commercially available aligner and the photoresist of the type mentioned above is then exposed to light in a range of wavelengths of 327 nm–400 nm, for example. The mask 30 may also be disposed remote from the photoresist and the mask image projected onto the photoresist using an optical imaging or scanning system. Accordingly, photo reduction (demagnification) or photo enlargement (magnification) of the image in the gray scale mask may be carried out on photoresist, if desired.

Preparation of the substrate and photoresist, using a photoresist of the type mentioned hereinabove (OeBr-514) or another ultraviolet curable polymer may be carried out by spinning a layer of photoresist onto the substrate at a speed of about 4,000 rpm, for about 30 seconds, for example. A 0.8 μm thick layer applied to a quartz glass substrate may be obtained and, the photoresist coated substrate baked for about 30 minutes at 90° C. prior to exposure of the resist through the gray level mask.

After exposure of the photoresist 16 with the gray scale mask 30, development of the photoresist may be carried out by post-baking the resist for a predetermined period and at a relatively low temperature so as to avoid reflow of the resist during the post-baking procedure which might result in a degraded profile of the micro-element. Alternatively, the photoresist may be developed in a metal ion-free developer such as a type made by Shipley Corporation. The photoresist-coated substrate may then be subjected to a conventional etching process such as an ion beam milling procedure. A Veeco Instruments Microtech 301-type milling system may be used, for example.

The ion milling system may be modified to accommodate the introduction of reactive gasses to provide chemically assisted ion beam etching. Chemically assisted ion beam etching is advantageous because it allows for the accurate control of the energy, number and incidence angle of ions during the milling process. Moreover, the amount of released reactive gas can be chosen freely which allows for control of the q-factor. The q-factor is defined as the substrate etch rate to the resist etch rate. Varying the q-factor provides for varying the feature depth in the final micro-element to fit a specific application. For example, in the fabrication of diffractive optical elements, the feature depth in the final configuration will be dictated by the specific application, wave length of light to be transmitted, the refractive index of the substrate material, the refractive index of the surrounding environment, or dimensional constraints on the substrate structure. Variation in the amount of reactive gas, such as $CHF_3$, introduced into the etching system will allow a change in the q-factor ranging from 1.8 to 4.3, for example. A higher q-factor is usually necessary to achieve a high etch depth required for elements transmitting longer wave-length light and also allows the reduction in the resist thickness which will result in enhanced resolution. Lower q-factors may be useful in achieving low feature depth and high accuracy needed for reflection type optical elements.

Figure 7:
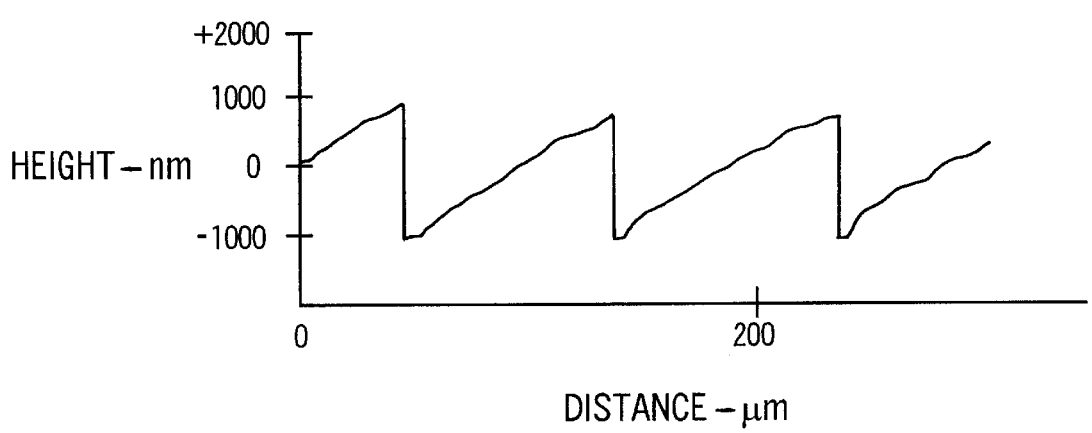
FIG. 7 is a diagram showing the geometry of a micro-lens fabricated in accordance with the method of the invention.

FIG. 7 illustrates a portion of the actual profile of a micro-spherical lens substantially like lens 9 and fabricated in accordance with the present invention wherein an overall height of the lens profile in the range of about 2000–2100 nm was achieved. The previously described technique was used to produce a 2×2 array of spherical lenses having an f number of nineteen and a focal length of 96 mm. A gray scale mask was fabricated of a high energy beam sensitive glass plate having a thickness of approximately 90 mils. The mask was exposed in a Cambridge Model EBMF 10.5 Electron Beam Writer which was controlled in accordance with aforedescribed procedure to produce thirty-two discrete levels of darkening of the mask in a predetermined pattern on 0.1 $\mu$m spacing. The electron beam writer was controlled by a computer-aided design program developed for the University of California at San Diego to facilitate data generation necessary for direct write procedures with the electron beam writer. Electron beam charge density level for each depth or phase level in the final etched element profile can be included in data files used to operate the electron beam writer. This may be carried out by changing the writing frequency for different areas of the produced micro-element. Substrate material for the diffractive optical elements was fused silica. The diffractive optical element was, in particular, designed for an operational wavelength of 830 nm. The optical efficiency of the lens produced showed a 94% efficiency which is comparable to an efficiency measurement taken for a substantially identical lens fabricated by direct write methods.

A 10×10 array of spherical lenses of 100 mm by 100 mm size, an f number of 3.10 and a focal length of 4.4 mm was also fabricated using the above mentioned process for fabrication of the gray scale mask and the subsequent fabrication of the optical elements utilizing chemically assisted ion beam etching to transfer the resist profile into a quartz glass substrate.

As mentioned previously, a gray scale mask in accordance with the present invention may be advantageously used for mass production of diffractive optical elements, computer generated holograms and other micro-elements in a step and repeat fabrication system. In particular, a relatively large substrate member, suitably coated with photoresist may be exposed through a gray scale mask, such as the mask 30 in a commercially available aligner of a demagnification type or a contact type wherein the geometry of plural diffractive optical elements may be imprinted on the photoresist, the substrate member may be moved relative to the gray scale mask and the exposure step repeated so that a large array of micro-elements is imprinted on the photoresist step by step. This relatively large array of micro-elements may then be fabricated in a batch by a chemically assisted ion beam etching process, as described above, to transfer the geometry of the-micro-elements in the photoresist to the substrate member. Step and repeat or so-called stepper processes may, thus, be carried out with gray scale masks in accordance with the invention. Accordingly, the manufacture of various types of micro-elements as described herein, may be more efficiently and economically carried out.

Although preferred embodiments of the present invention have been described in detail herein, those skilled in the art will recognize that various substitutions and modifications may be made to the invention without departing from the scope and spirit of the appended claims.

What is claimed is:

1. A method of fabricating a three-dimensional micro-optic lens on a substrate selected from a group consisting of quartz glass, silicate glass, germanium and an optically transmissive material coated with a photoresist layer, comprising:

providing a gray scale mask having a body portion and a surface layer formed thereon which is responsive to electron beam radiation to change the optical density of the surface layer;

exposing the mask to an electron beam of selected charge density over a grid of discrete locations on the mask to provide a predetermined gray scale pattern of continuously varying optical transmissivity on the mask;

exposing the photoresist layer to radiation transmitted through the mask; and removing material from the photoresist layer and the substrate to provide a predetermined varying thickness of the substrate as determined by the gray scale patterns on the mask.

2. The method set forth in claim 1 including the step of:
generating said electron beam with a current of at least about 25 nA.

3. The method set forth in claim 1 including the step of:
applying an electrically conductive coating to the mask prior to exposing the mask to said electron beam and removing said coating from the mask after exposing the mask to said electron beam.

4. The method set forth in claim 1 including the step of:
removing material from said photoresist layer and said substrate by chemically assisted ion beam etching.

5. The method set forth in claim 1 including the step of:
comparing a thickness of said photoresist layer which may be exposed to radiation with a corresponding electron beam charge density value required to darken said layer of the mask to provide a predetermined depth level in said substrate; and exposing the mask to said electron beam at a preselected charge density corresponding to the desired thickness of exposure of said photoresist layer.

6. A method for producing various depth levels in a layer of photoresist material including the steps of:

exposing a layer of photoresist material to radiation through a gray scale mask having areas of continuously varying transmissivity;

removing photoresist material from said photoresist layer to depth in said photoresist layer at a predetermined position thereon corresponding to a predetermined transmissivity of said gray scale Mask at a corresponding predetermined position on said gray scale mask; and providing said gray scale mask as a glass article comprising a body portion and an integral ion exchanged surface layer which, upon exposure to a high energy electron beam, becomes darkened and is substantially insensitive to actinic radiation.

7. The method set forth in claim 6 including the step of:

exposing said gray scale mask to selected discrete charge densities of electron beam radiation over a grid of preselected grid spacings and varying the electron beam charge density from one spacing to the next in accordance with a predetermined depth level desired to be produced in said photoresist layer.

8. The method set forth in claim 6 including the step of:

comparing a thickness of said photoresist layer which may be exposed to radiation with a corresponding electron beam charge density value required to darken said gray scale mask to provide a predetermined depth level in said photoresist layer; and exposing said gray scale mask to said electron beam at a preselected charge density corresponding to the desired thickness of exposure of said photoresist layer.

9. The method set forth in claim 6 including the step of:

selectively darkening a surface layer of said gray scale mask by generating an electron beam at discrete, predetermined positions thereon and at an acceleration voltage of at least about 20 kV.

10. A method of fabricating a three-dimensional microelement on a substrate to various depth levels comprising one of discrete depth levels and a continuous depth profile through a photoresist layer, comprising the steps of:

exposing said photoresist layer to radiation transmitted through a gray scale mask having a gray scale pattern thereon comprising image areas having a continuously varying transmissivity corresponding to a depth of material to be removed from said substrate to provide said element;

removing material from said photoresist layer and said substrate in a predetermined pattern as determined by said gray scale pattern on said mask;

providing said gray scale mask characterized as a glass article comprising a body portion and an integral radiation absorbing surface layer which is substantially insensitive to actinic radiation; and providing said glass article with said ion exchanged surface layer having Ag+ ions therein, and/or silver halide containing and/or $Ag_2O$ containing and/or Ag+ ion containing micro-crystals and/or micro-phases therein.

11. The method set forth in claim 10 including the step of:

exposing the mask to an electron beam at a predetermined dosage corresponding to a degree of darkening of the mask required to produce a predetermined depth level in said photoresist layer.

12. The method set forth in claim 11 including the step of:

darkening the mask by generating an electron beam at an acceleration voltage in the range of 20 kV to 30 kV.

13. The method set forth in claim 11 including the step of:

exposing the mask to an electron beam charge density of 0 $mC/cm^2$ to about 400 $mC/cm^2$.

14. The method set forth in claim 11 including the step of:

generating said electron beam with a current of at least about 25 nA.

15. The method set forth in claim 11 including the step of:

applying an electrically conductive coating to the mask prior to exposing the mask to said electron beam.

16. The method set forth in claim 15 including the step of:

removing said coating from the mask after exposing the mask to said electron beam.

17. The method set forth in claim 11 including the step of:

comparing a thickness of said photoresist layer which may be exposed to radiation with a corresponding electron beam charge density value required to darken the mask to provide a predetermined depth level in said substrate; and exposing the mask to said electron beam at a preselected charge density corresponding to the desired thickness of exposure of said photoresist layer.

18. The method set forth in claim 17 including the step of:

exposing the mask to selected discrete charge densities of electron beam radiation over a grid of preselected grid spacings and varying the electron beam charge density from one spacing to the next in accordance with a predetermined depth level desired to be produced in said substrate.

19. A method of fabricating a three-dimensional microelement on a substrate and to various depth levels comprising one of discrete depth levels and a continuously depth profile through a photoresist layer, comprising the steps of providing a gray scale mask characterized as a glass article comprising a body portion and an internal radiation absorbing surface layer which is substantially insensitive to actinic radiation; and providing said glass article as a silicate glass having a silicon dioxide content in mole percent of from 30 to 95 and essentially no transition metals having 1–4 d electrons in the atomic state and at least one surface of said article having a substantially continuous silver and hydration content over its area, effective to render said surface darkenable upon exposure to electron beam radiation.

* * * * *